(12) United States Patent
Kim

(10) Patent No.: US 7,551,474 B2
(45) Date of Patent: Jun. 23, 2009

(54) DRAM INCLUDING A REDUCED STORAGE CAPACITOR

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

(21) Appl. No.: 12/276,315

(22) Filed: Nov. 22, 2008

(65) Prior Publication Data

US 2009/0103352 A1     Apr. 23, 2009

Related U.S. Application Data

(63) Continuation of application No. 11/877,044, filed on Oct. 23, 2007, now Pat. No. 7,443,714, and a continuation of application No. 12/202,313, filed on Aug. 31, 2008.

(51) Int. Cl.
    *G11C 11/24* (2006.01)
(52) U.S. Cl. ............. 365/149; 365/189.15; 365/189.16; 365/189.17; 365/207
(58) Field of Classification Search ................. 365/149, 365/189.15, 189.16, 189.17, 207
    See application file for complete search history.

(56) References Cited

U.S. PATENT DOCUMENTS

| | | | |
|---|---|---|---|
| 5,715,189 | A | 2/1998 | Asakura |
| 6,426,905 | B1 | 7/2002 | Dennard et al. |
| 6,456,521 | B1 | 9/2002 | Hsu et al. |
| 2003/0002349 | A1 * | 1/2003 | Pilo et al. ............ 365/189.01 |

OTHER PUBLICATIONS

A hierarchical bit-line architecture with flexible redundancy and block compare test for 256 Mb DRAM in VLSI Circuits, Digest of Technical Papers, May 1993.
A 322 MHz Random-Cycle Embedded DRAM With High-Accuracy Sensing and Tuning, IEEE Journal of Solid-State Circuits, vol. 40, No. 11, Nov. 2005.
A 500MHz Random Cycle 1.5ns-Latency, SOI Embedded DRAM Macro Featuring a 3T Micro Sense Amplifier, IEEE International Solid-State Circuits Conference, pp. 486, 2007.

* cited by examiner

*Primary Examiner*—Hoai V Ho

(57) ABSTRACT

A reduced storage capacitor is used for shrinking a memory cell in DRAM, and local bit line is divided into short line for reducing parasitic capacitance. For reading, a first reduced swing amplifier as a local sense amp reads the memory cell through the local bit line, and a second reduced swing amplifier as a global sense amp reads the local sense amp through a global bit line. With the multi-stage sense amps, time domain sensing scheme is realized such that a voltage difference in the local bit line is converted to a time difference, for differentiating high data and low data, and also fast read operation is realized. And write operation is executed by a reduced swing write driver. With reduced voltage swing, pseudo negative word line scheme is realized for retaining data, and power consumption is reduced. In addition, various alternative circuits and memory cell structures are implemented.

20 Claims, 11 Drawing Sheets

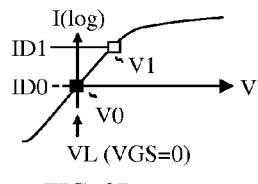
FIG. 2B
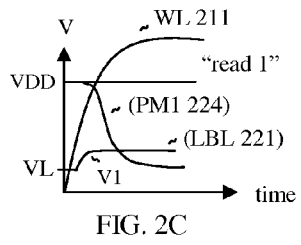
FIG. 2C
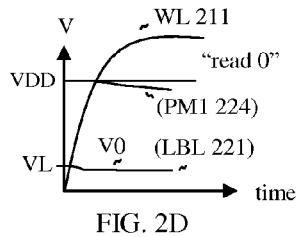
FIG. 2D
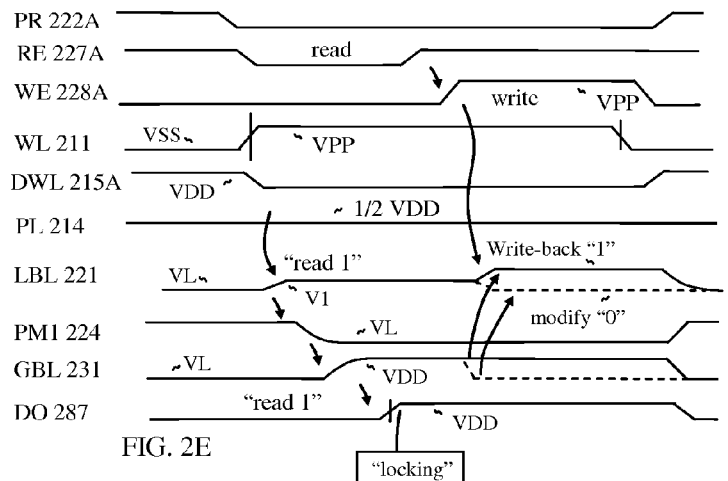
FIG. 2E
FIG. 2F
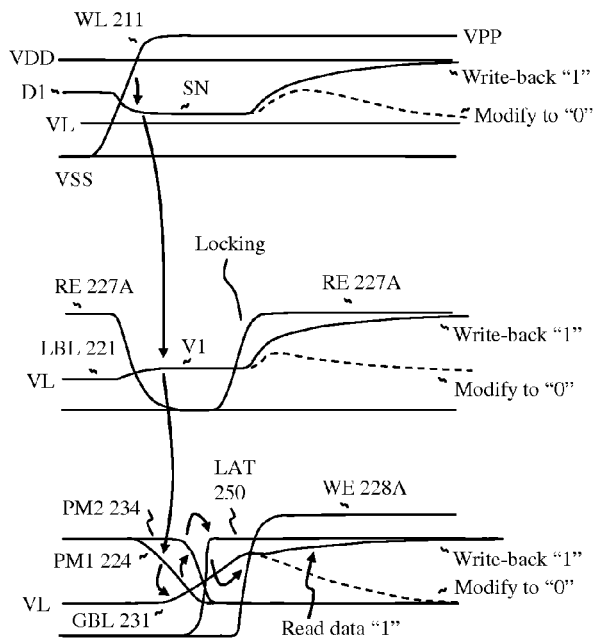
FIG. 2G
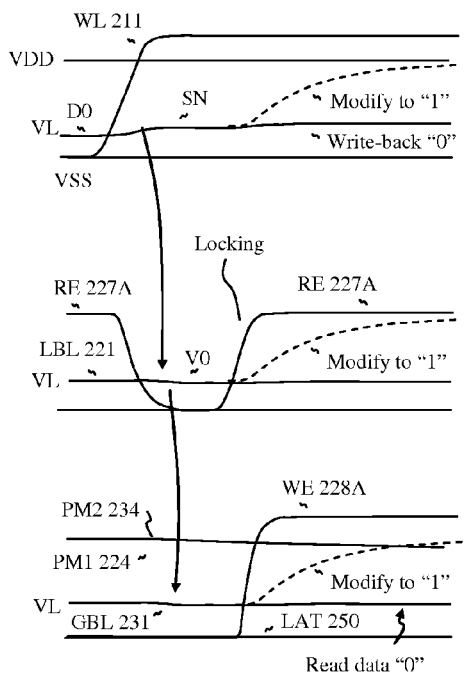
FIG. 2H FIG. 6A  (6F² Cell)

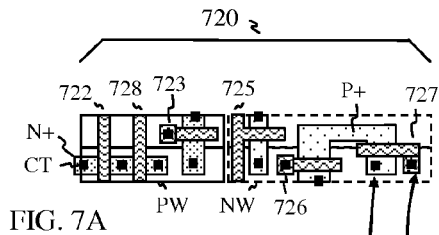
FIG. 7A
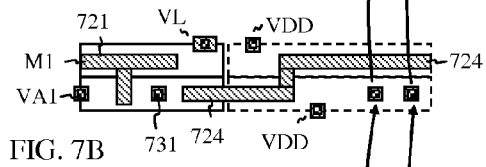
FIG. 7B
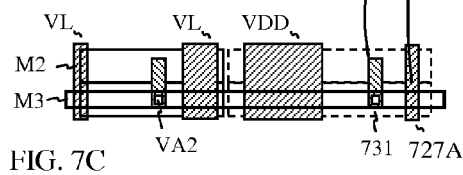
FIG. 7C
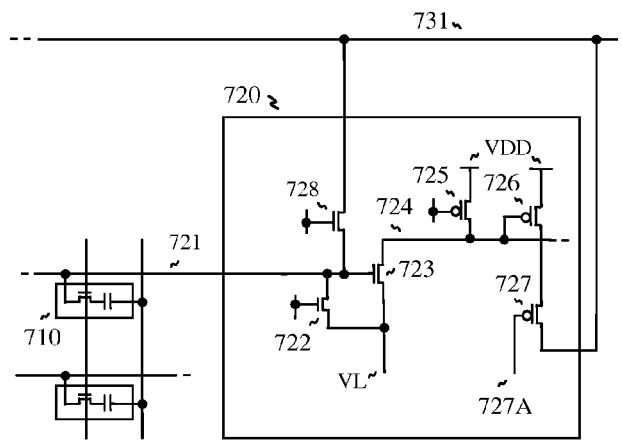
FIG. 7D
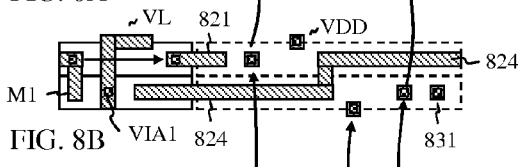
FIG. 8A
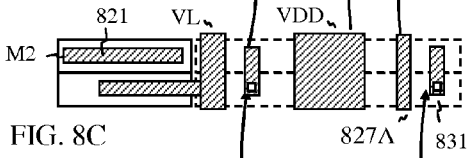
FIG. 8B
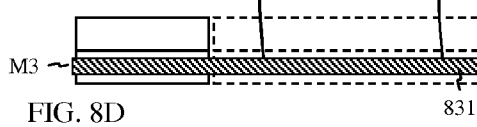
FIG. 8C
FIG. 8D
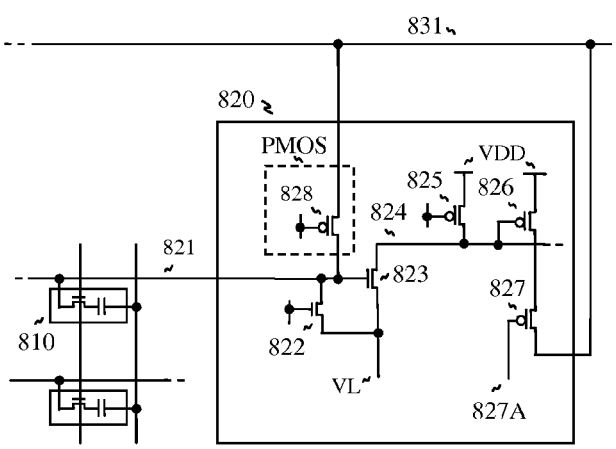
FIG. 8E (8F² Cell)

DRAM INCLUDING A REDUCED STORAGE CAPACITOR

CROSS REFERENCE TO RELATED APPLICATION

The present invention is a continuation of application Ser. No. 11/877,044, filed on Oct. 23, 2007, now, U.S. Pat. No. 7,443,714, and application Ser. No. 12/202,313, filed on Aug. 31, 2008, which are herein incorporated by reference.

FIELD OF THE INVENTION

The present invention relates generally to integrated circuits, in particular to DRAM (Dynamic Random Access Memory).

BACKGROUND OF THE INVENTION

For its high-density, the DRAM (Dynamic Random Access Memory) is utilized extensively as a main memory in computer systems, even though it requires refresh cycle to sustain stored data within a predetermined refresh time. As such, the DRAM constitutes a key component that holds sway on the performance of the computer system. Efforts of research and development have been under way primarily to boost the density and also speed improvement.

In the conventional DRAM, hierarchical bit line architecture is applied to achieve high-speed operation, as published, "Hierarchical bitline DRAM architecture system" as U.S. Pat. No. 6,456,521, and "A hierarchical bit-line architecture with flexible redundancy and block compare test for 256 Mb DRAM" in VLSI Circuits, Digest of Technical Papers, May 1993. pp 93-94. More specifically, FIG. 1 illustrates a circuit diagram of the conventional DRAM. The memory cells 101 and 102 are connected to a local bit line 131, and the memory cells 103 and 104 are connected to another local bit line 133, where the plate of capacitor is connected half VDD supply voltage typically. Local bit lines 131 and 133 are connected to a global bit line 111 and another global bit line 112 through transfer transistors 121 and 123, respectively. And more local bit lines 132 and 134 are connected to the global bit lines 111 and 112, respectively. When reading, one of memory cells is selected, and the selected cell charges or discharges the local bit line while the local bit lines and the global lines are released from pre-charge node 117, such that equalizer transistor 113, pre-charge transistors 114 and 115 are turned off by a control signal 116. Thus, one of global bit lines is also charged or discharged by the selected memory cell. After then sense amp 141 is activated to generate a read output 142. However, the selected global bit line is slowly changed because the selected memory cell should drive local bit line and global bit line through transfer transistor, where the global bit line increases total capacitance. Moreover, the storage capacitor in the memory cell should be relatively big in order to absorb the charges from the global bit line, which is one of major obstacles to reduce the DRAM cell. As a result, access time is also slow because of heavy global bit line, which increases propagation delay and sensing time for the sense amp.

For writing data, a write data line (not shown) is connected to the sense amp 141. Conventionally, the write data line is heavily loaded with no buffers, so that the write data line always drives full length in a memory bank or multiple memory blocks, which increases driving current and RC delay time. For reading data, a read data line (not shown) is connected to the sense amp with full length of the memory bank as well. Moreover, access time is different depending on location of a selected memory cell. For example, access time from the sense amp near a data output circuit is faster than that of the sense amp far from the data output circuit, so that it is difficult to latch the sense amp output at high speed, because a latching clock is fixed (not shown).

And there is a prior art for improving DRAM with adding a local sense amp, as published, "High speed DRAM local bit line sense amplifier", U.S. Pat. No. 6,426,905, wherein the local sense amplifier detects a change of charge out of an input node, and comprises a first current source and a first field effect transistor. The current source is provided for removing charge from the input node. The field effect transistor includes (i) a source coupled to the input node, (ii) a gate electrode coupled to a first voltage, and (iii) a drain coupled to one side of a first capacitor, to an output node, and to a pre-charge circuit for setting the voltage of the output node to a second voltage, providing a voltage difference between the drain and source of said first transistor. The other side of the capacitor is coupled to ground. However, many transistors (total 11 transistors) for each local sense amplifier are required, such that chip area is sacrificed for the improvement.

And more prior arts are shown for dividing the bit line into short lines, "A 322 MHz Random-Cycle Embedded DRAM With High-Accuracy Sensing and Tuning", IEEE Journal of Solid-State Circuits, Vol. 40, No. 11, November 2005, and "A 500 MHz Random Cycle 1.5 ns-Latency, SOI Embedded DRAM Macro Featuring a 3T Micro Sense Amplifier", IEEE International Solid-State Circuits Conference, pp. 486, 2007. However, those prior arts still use conventional differential sense amplifier for reading data from the memory cell. In consequence, the area of the chip is increased more, which is one of obstacles for realizing very high density and high speed memory with local sense amps.

Furthermore, memory cell structure of the conventional DRAM includes a cup-like stacked capacitor as published U.S. Pat. No. 7,183,603 and a deep trench capacitor as published U.S. Pat. No. 6,608,341. Hence, scaling big storage capacitor is one of major obstacles, because total storage capacitance should be maintained around 20-30fF for reading the memory cell through a heavy bit line and also retaining data within same or longer refresh time. In order to avoid forming the big storage capacitor, sensing scheme should be improved to read a reduced capacitor memory cell, which also should improve access time. And in order to retain data for long time even though the capacitor is reduced, leakage current of the memory cell should be reduced with circuit techniques.

In this respect, there is still a need for improving the DRAM. In the present invention, sophisticated circuit techniques are introduced for reducing a storage capacitor in a memory cell. And the memory cell can be formed on the surface of the wafer. And the steps in the process flow should be compatible within the current CMOS manufacturing environment. Alternatively, the memory cell can be formed from thin film polysilicon layer, because lightly loaded bit line can be quickly discharged by the memory cell with light bit line architecture, even though the thin film pass transistor can flow relatively low current. In doing so, multi-stacked memory is realized with thin film transistor, which can increase the density within the conventional CMOS process with additional process steps, because the conventional CMOS process is reached to a scaling limit for fabricating transistors on a surface of a wafer. In addition, a body-tied TFT (Thin Film Transistor) transistor can be used as the thin film transistor for alleviating self heating problem of short channel TFT.

SUMMARY OF THE INVENTION

In the present invention, sophisticated circuit techniques are introduced for reducing a storage capacitor in the DRAM, so that a reduced storage capacitor, for instance, 1fF capacitor, can be used for configuring the DRAM. For reading the 1fF capacitor, bit line capacitance is proportionally reduced to around 1fF by multi-dividing the bit line, which realizes fast read operation with multi-stage sense amps including reduced swing amplifiers. When writing, the 1fF capacitor is quickly charged, so that write operation is improved. And write-back operation is executed by a global write circuit with reduced voltage swing. With reduced swing voltage, pseudo negative word line scheme is realized for retaining the stored charges for long time. In doing so, high density DRAM can be fabricated with a large amount of logic circuits on a chip for configuring high performance system on chip, because 1fF capacitor or below can be formed without complex capacitor forming process. On the contrary, the conventional DRAM uses a cup-like big capacitor, such as, 20~30fF, as the storage capacitor. Hence, it is more difficult to fabricate the big capacitor on the wafer in the future, because feature size is approaching to almost scaling limit.

More specifically, for realizing high speed and low power DRAM with the small storage capacitor, bit line is multi-divided for reducing parasitic capacitance of the bit line, so that the lightly loaded bit line is quickly charged or discharge by the memory cell having the small capacitor when reading. And multi-stage sense amps are used, such that the memory cell is read by a first reduced swing amplifier serving as a local sense amp through the lightly loaded local bit line, and the local sense amp is read by a second reduced swing amplifier serving as a global sense amp through a global bit line. With multi-stage amps, fast read operation is realized. Furthermore, low power operation is realized with reduced swing amplifiers because voltage swing is reduced during operation. And also a global write circuit is connected to the memory cell through the local bit line and the global bit line for limiting the voltage swing.

During read operation, a voltage difference in the local bit line is converted to a time difference for differentiating high data and low data. For example, high data is quickly transferred to an output latch circuit through the amplifiers with high gain, but low data is rejected by a locking signal based on high data as a reference signal. In this manner, time domain sensing scheme is realized to differentiate high (voltage) data and low (voltage) data. In detail, a reference signal is generated by one of fast changing data with high gain from reference cells, which signal serves as a reference signal to generate a locking signal in order to reject latching another data which is slowly changed with low gain, such that high voltage data is arrived first while low voltage data is arrived later, or low voltage data is arrived first while high voltage data is arrived later depending on configuration. The time domain sensing scheme effectively differentiates high voltage data and low voltage data with time delay control, while the conventional sensing scheme is current-domain or voltage-domain sensing scheme. In the convention memory, the selected memory cell charges or discharges the bit line, and the charged or discharged voltage of the bit line is compared by a comparator which determines an output at a time. With time domain sensing, there are many advantages to read the memory cell, so that the sensing time is easily controlled by a tunable delay circuit, which compensates cell-to-cell variation and wafer-to-wafer variation, thus there is a need for adding a delay time before locking the output latch circuit with a statistical data for all the memory cells, such as mean time between fast data and slow data. Thereby the tunable delay circuit generates a delay time for optimum range. And the read output from the memory cell is transferred to the output latch circuit through a returning read path, thus the access time is equal regardless of the location of the selected memory cell, which is advantageous to transfer the read output to the external pad at a time.

For storing the charges in the small storage capacitor within a predetermined retention time, pseudo negative word line scheme is devised, so that the word line of the memory cell is forced to ground voltage and the bit line is pre-charged to a limited voltage as a pre-charge voltage. Thus, negative word line is virtually forced for storing data "1" when a storage node voltage is charged near supply voltage because drain/source voltage to word line as a gate voltage is negative. This means that data "1" is stored under pseudo negative word line even though the word line is actually forced to ground voltage. However data "0" is rejected to be read by the locking signal in the time domain sensing scheme. In doing so, sub-threshold leakage current is significantly reduced in exponential subthreshold region of a MOS transistor while storing data "1". Furthermore, back bias voltage for a pass transistor of the memory cell is not required because back bias voltage is used for avoiding forward biasing from overshoot when storing data "0", while data "1" is reversed biased from the body. Without negative biasing to the body of the pass transistor, reverse leakage current is reduced with reduced potential difference between the storage node and the body while storing data "1" for long time. And, the time domain sensing scheme can effectively reject to be read data "0".

Configuring memory is more flexible, such that multiple memory macros can be configured with small segmented memory array and multi-stage sense amps, instead of big macro with the conventional sense amp which includes differential amps, write circuits and equalization circuits. And number of sense amps can be determined by the target speed. For example, high speed application needs more segmented array with more sense amps, while high density application needs more memory cells with reduced number of sense amps, thus cell efficiency is increased.

And, the local sense amp has high gain with wider channel MOS transistor than that of the memory cell. Hence, the stored data in the memory cell is quickly transferred to the latch in the global sense amp. After then, the data transfer circuit transfers a read output to data output node through buffers, which realizes fast read operation with no extra waiting time.

A buffered data path is connected to the global sense amp for writing and reading a data, wherein a write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

And fingered shape capacitor can be used as a storage capacitor for increasing memory cell capacitance in a given area, which realizes very high density memory, wherein the fingered shape capacitor is composed of a first fingered shape plate and a second fingered shape plate with no cup-like capacitor and no deep trench capacitor. And also multiple fingered shape capacitors can be formed in between metal routing layers for eliminating deep contact, where each capacitor is connected through relatively shallow contact. In doing so, the memory cell can be miniaturized further with reduced capacitor.

The present invention realizes multi-stacked memory cell structure including thin film transistor because the memory cell only drives lightly loaded bit line even though thin film polysilicon transistor can flow lower current, 10~20 times lower, for example.

Furthermore, example memory cell layout and cross sectional views are illustrated to minimize cell area. And the fabrication method is compatible with the conventional CMOS process including single-crystal-based regular transistor. And alternatively, additional steps are required for using thin film transistor as a pass transistor of the memory cell. And the memory cell can be formed from various semiconductor materials, such as silicon-germanium and germanium.

Still, furthermore, various dielectric materials can be used for forming the capacitor. For example, DRAM uses ordinary dielectric material, such as silicon dioxide, silicon nitride, Ta2O5, TiO2, Al2O3, TiN/HfO2/TiN(TIT), and Ru/Insulator/TiN(RIT). And PIP (Polysilicon Insulator Polysilicon) capacitor structure and MIM (Metal Insulator Metal) capacitor structure can be used for forming the capacitor.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 2B illustrates an I-V curve of the local pre amplifier of the local sense amp when reading, FIG. 2C illustrates waveform of the local bit line when reading data "1", FIG. 2D illustrates waveform of the local bit line when reading data "0", FIG. 2E illustrates timing diagram when reading data "1", FIG. 2F illustrates timing diagram when reading data "0", FIG. 2G illustrates simulated waveforms when reading data "1", and FIG. 2H illustrates simulated waveforms when reading data "0", according to the teachings of the present invention.

FIGS. 6A, 6B, 6C and 6D illustrate an example memory cell layout for an open bit line architecture.

FIGS. 7A, 7B and 7C illustrate an example layout for the local sense amp, and FIG. 7D illustrates the related local sense amp circuit for explaining the layout, according to the teachings of the present invention.

FIGS. 8A, 8B, 8C and 8D illustrate alternative layout for the local sense amp including a PMOS write transistor and FIG. 8E illustrates the related local sense amp circuit for explaining the layout, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
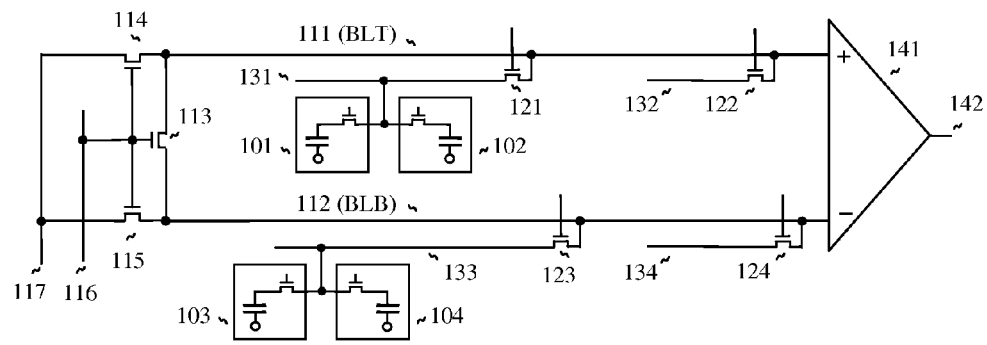
FIG. 1 illustrates a dynamic random access memory, as a prior art.
Figure 2A:
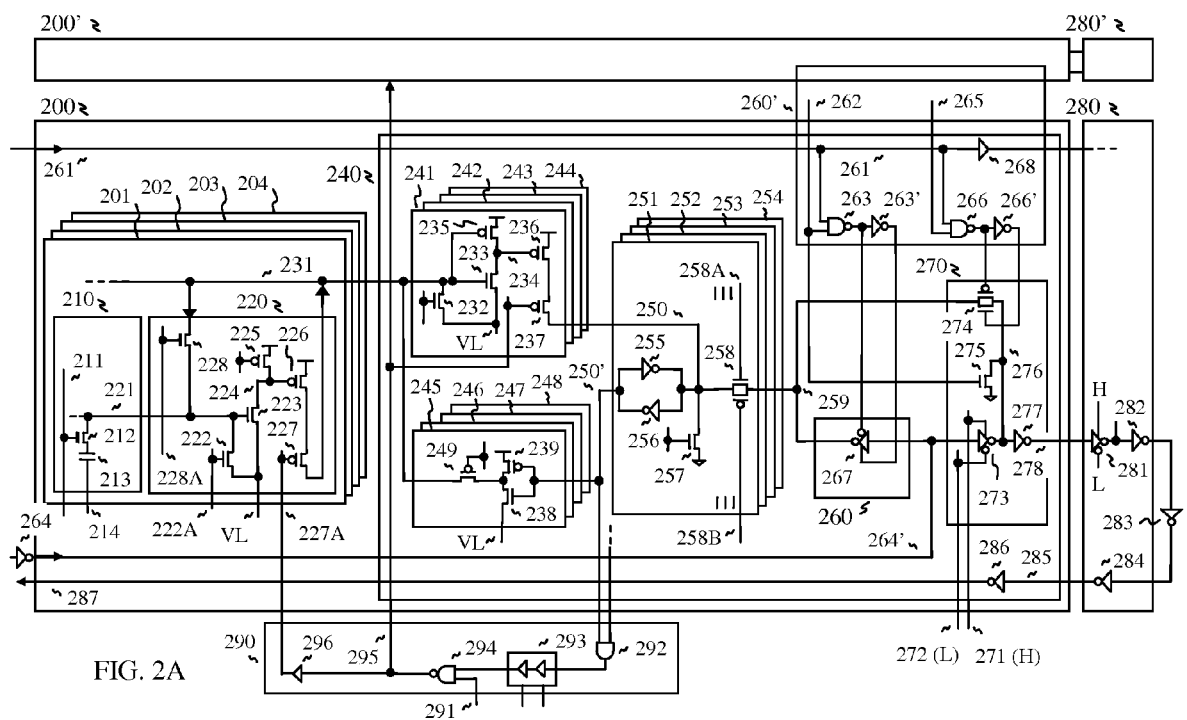
FIG. 2A illustrates DRAM including a reduced storage capacitor as the present invention.

The present invention is directed to DRAM including a reduced storage capacitor as shown in FIG. 2A, wherein a memory block 200 comprises memory segments 201, 202, 203 and 204, and a global sense amp 240. The memory segment 201 includes a memory cell 210 and a local sense amp 220, wherein the memory cell 210 is composed of a pass transistor 212 and the reduced storage capacitor 213 which is connected to a plate line 214.

For reading and writing the memory cell, the pass transistor 212 is connected to a word line 211, and the local sense amp 220 is connected to the memory cell through a local bit line 221. For receiving the local sense amp output, the global sense amp 240 is connected to the local sense amp 220 through a global bit line 231. And the global sense amp 240 is also connected to next memory block 280.

For reading and writing data, a buffered data path is connected to the global sense amp, such that the buffered data path includes a forwarding write path and a returning read path, which realize to improve performance, because data line is divided into short lines for transferring data while unselected portion of the data line is not discharging for reducing discharging current when writing. Hence, a write line 264' serves as the forwarding write path, such that the write line 264' receives an inverting write data from a write inverter 264 when a receive switch 267 of a data receive circuit 260 is enabled. When reading, unselected portion of the data line is used as a read line 278 serving as the forwarding read path, such that the read line 278 receives a read output from the memory cell through multi-stage sense amps. And the read line 278 is buffered by multiple buffers including returning buffers 284 and 286 through a returning read line 285. With the returning read path, access time is almost same regardless of selected memory cell location, which realizes to latch the read output at a time with enough set-up and hold time even though a latch clock is fixed. More detailed read operation and write operation will be explained as below.

For reading stored charges in the memory cell, the local sense amp 220 is connected to the memory cell 210 through the local bit line 221, wherein the local sense amp 220 is composed of a first reduced swing amplifier for reducing swing voltage, which reduces power consumption during operation. Furthermore, the first reduced swing amplifier limits the bit line swing above the pre-charge voltage, so that word line voltage is always negative from the stored voltage in a storage node of the memory cell. In this manner, pseudo negative word line scheme is realized, which significantly reduces subthreshold leakage current for storing data.

The local sense amp 220 includes the first reduced swing amplifier for reading and a write transistor for writing, wherein the first reduced swing amplifier is connected to the memory cell 210 through the local bit line 221, such that the first reduced swing amplifier is composed of a local pre amplifier including a local pre-charge transistor 222 for pre-charging the local bit line 221 to a pre-charge voltage VL as a low limit voltage, a local pre-amp transistor 223 for detecting whether the local bit line 221 is higher than the pre-charge voltage VL or not, a local pre-set transistor 225 for pre-setting a local pre-amp node 224 connecting to the local pre-amp transistor 223, and a local main amplifier including a local main-amp transistor 226 for pulling up a global bit line 231 through a local select transistor 227 when the local pre-amp node 224 is discharged by the local pre-amp transistor 223, and the write transistor 228 is connected to the local bit line 221 for receiving a voltage output of the global bit line 231. For obtaining high gain, the local pre-amp transistor 223 is used as the pre amplifier for discharging the local pre-amp node 225, and the main amplifier pulls up the global bit line 231 strongly, because the local pre-amp node 225 is extremely light and the global bit line 231 is relatively heavy. And the pre-charge voltage is set around 0.5V for pre-charging the local bit line, for instance.

And the global sense amp 240 is connected to the local sense amp 220 through the global bit line 231, wherein the global sense amp 240 is composed of multiple components including second reduced swing amplifiers 241, 242, 243 and 244 as global read circuits, global write circuits 245, 246, 247 and 248, global latch circuits 251, 252, 253, and 254, a data transfer circuit 270 and a data receive circuit including 260 and 260', for realizing one of four column decoding in the right hand side and another one of four column decoding is realized in the left hand side with same circuit (not shown).

More specifically, the second reduced swing amplifier serves as the global read circuit 241 for reading the memory cell 210 through the global bit line 231, wherein the second reduced swing amplifier 241 is composed of a global pre amplifier including a global pre-charge transistor 232 for pre-charging the global bit line 231 to the pre-charge voltage VL, a global pre-amp transistor 233 for detecting whether the global bit line 231 is higher than the pre-charge voltage VL or not, and a global main amplifier including a global pre-set transistor 235 for pre-setting a global pre-amp node 234 connecting to the global pre-amp transistor 233, a global main-amp transistor 236 for transferring output to the global latch circuit 251 through a global select transistor 237 when the global pre-amp node 224 is discharged by the global pre-amp transistor 223. The global main amp transistor 236 is much stronger than the global pre-amp transistor 233 for pulling up a latch node 250 of the global latch circuit 251 when reading data "1". And the global pre-set transistor 235 receives the global bit line voltage for pre-setting the global pre-amp node 234, which configures an inverter. Alternatively, the global pre-set transistor 235 can be controlled by a pre-set control signal (not shown), as the local pre-set transistor 225 is controlled.

And the global write circuit 245 is used for driving the global bit line 231 to the pre-charge voltage VL when writing data "0" or a supply voltage when writing data "1", wherein the global write circuit 245 is composed of a reduced swing inverter including a pull up transistor 239 and a pull down transistor 238 which is connected to VL voltage, and a write drive transistor 249, for transferring write data to the global bit line 231 through another latch node 250' of the global latch circuit 251, where the global latch circuit 251 receives write data through the receive switch 267.

And the global latch circuit 251 is connected to the global read circuit 241 through a latch node 250, and the global write circuit 245 through a select transmission gate 258 and an internal node 259, wherein the global latch circuit 251 is composed of a cross coupled inverters 255 and 256, a latch reset transistor 257 and the select transmission gate 258 which is controlled by column select signals 258A and 258B. And the global latch circuit 251 is connected to a locking signal 295 for disabling the global select transistor 237 after the read output is reached to the global latch circuit 251, such that the global select transistor 237 is disabled by asserting the locking signal 295 which is generated by a locking signal generator 290, wherein the locking signal generator 290 is composed of an AND gate 292 for receiving an output from the global latch circuit 251, a tunable delay circuit 293 (shown in FIG. 5A) for delaying the read output of the global latch circuit 251 and a NAND gate 294 for generating the locking signal 295 when a block read enable signal 291 is asserted to high. And the locking signal 295 is generated as long as one of reference memory cells works correctly. Similarly, a buffer 296 generates a local locking signal 227A for disabling the local select transistor 227 before writing.

And one of the read outputs in the global latch circuits is selected by the select transmission gate 258. A data transfer circuit 270 is connected to the transmission gate 258 for receiving the read output from the global latch circuit and transferring the read output to the read line 278, and also a data receive circuit 260 is connected to the global latch circuit 251 for receiving and a write input from a write line 264'. And a returning buffer 286 is located in the global sense amp for buffering the read line 285 which serves as the returning read line connecting to next memory block 280.

For enabling write path, a column write signal 261 is connected to a NAND gate 263 which is part of the data receive circuit 260'. And an inverter 263' is connected to the NAND gate 263, so that the receive switch 267 is enabled by the NAND gate 263 and the inverter 263' in the data receive circuit 260', when a block write signal 262 is asserted to high. And a buffer 268 is added in order to buffer the column write signal 261 to the next memory block 280. And for reducing the repeating circuits further, the receive control circuit 260' is shared with adjacent memory block 200'. And the receive switch 267 is connected to the global latch circuit 251 for transferring a write input to the memory cell through the global write circuit 245 and the write transistor 228 of the local sense amp 220.

And the data transfer circuit 270 is used for receiving a read output from the global latch circuit 251 and transferring to the read line 278, wherein the data transfer circuit 270 includes a bypass tri-state inverter 273 connecting to the write line 264', a read inverter 277 connecting to a common node 276, and a read switch 274 connecting the global latch circuit 251 through the internal node 259 for transferring the read output, wherein the common node 276 is reset by a common reset transistor 275 when the block write signal 262 connecting to the data receive circuit 260' is asserted to high during write operation. During read operation, the common node 276 receives an output from the global latch circuit 251 through the read switch 274 while the bypass tri-state inverter 273 in the selected block 200 and 200' is turned off but the bypass tri-state inverter 281 in unselected blocks 280 and 280' is turned on for bypassing the read output. And the read switch 274 is selected by a NAND gate 266 and an inverter 266' in the data receive circuit 260', when a block read signal 265 is asserted to high. Thus, the read output is transferred to an output node 287 from the common node 276 through inverting buffers including 277, 281, 282, 283, 284 and 286.

During read operation, a stored data in the memory cell 210 is transferred to the global latch circuit 251 by the local sense amp 220 through the global bit line 231, for instance, high data is transferred to the global latch circuit 251 by the local sense amp 220 with high gain, but low data is not transferred by the local sense amp with low gain because the global read circuit 241 connecting to the global latch circuit 251 is disabled by the locking signal 295 which is based on high data, before low data is arrived. Furthermore, the global latch circuit 251 is also used for write-back operation when the memory cell is accessed because the stored data in the memory cell 210 is destructed by the charges of the local bit line 221 when reading.

Alternatively, in order to realize low power consumption during standby, the local pre-amp transistor 223, the local main-amp transistor 226 and the global pre-map transistor 233 are composed of slightly longer transistor than those of the local pre-charge transistor 222, the local pre-set transistor 225, the global pre-charge transistor 232, and the write drive transistor 249, while output of the reduced swing inverter including transistors 238 and 239 keeps low during standby. In doing so, turn-off current of the pre-amp and the main-amp transistors is reduced during operation and standby mode.

In the present invention, the local sense amp need not reference bit line because the local sense amp does not compare voltage or current with reference bit line, but the local sense amp detects whether the local pre-amp transistor 223 is turned on or not by the selected memory cell through the local bit line 221. Additionally, the local pre-amp transistor 223 and the global pre-amp transistor 233 can be composed of a low threshold MOS transistor as an alternative configuration for high speed application. Alternatively, the write transistor 228 can be composed of a low threshold MOS transistor as well for reducing threshold voltage drop.

For writing data, the data receive circuit 260 receives a write data through the write line 264'. Thus, the write data is transferred to the memory cell 210 through the global write circuit 245, the global latch circuit 251, and the receive switch 267, when the write transistor 228 in the local sense amp 220 is turned on by asserting the write enable signal 228A to VDD voltage. Alternatively for avoiding NMOS threshold voltage drop, the write enable signal 228A is asserted to higher than VDD+VT voltage, where VDD is a supply voltage and VT is threshold voltage of the MOS transistor. Or the write transistor 228 is composed of a PMOS transistor alternatively. And the word line 211 is raised to VDD voltage or VDD+VT voltage as well. During write operation, the local select transistor 227 and the global select transistor 237 are disabled for transferring the write data to the memory cell through the global bit line 231 and the global write circuit 245.

Referring now to FIG. 2B in view of FIG. 2A, I-V curve of the local pre-amp transistor 223 is illustrated in logarithmic scale when reading. When the memory cell 210 stores data "1", the local bit line 221 is raised from VL voltage to VI voltage while the local pre-charge transistor 222 is turned off by de-asserting a pre-charge signal 222A to low, and the word line 211 is asserted to a predetermined voltage. For instance, the local bit line voltage is raised from 0.5V to 0.85V when the stored voltage in the memory cell is 1.2V, where local bit line capacitance is 1fF and the storage capacitance is 1fF. Thereby the local pre-amp transistor 223 is turned on, which flows ID1 current, where threshold voltage VT of the local pre-amp transistor 223 is around 0.35V. Alternatively, the local pre-amp transistor 223 can be composed of low threshold MOS transistor. More accurately, the local pre-amp transistor 223 measures the voltage difference between the local bit line 221 and the VL voltage below sub-threshold region. When reading data "1", the local bit line voltage is 200 mV higher than VL voltage while threshold voltage is 250 mV, so that the local pre-amp transistor 223 can discharge the pre-amp node 224 because the parasitic capacitance of the pre-amp node 224 is extremely light without long routing line. As a result, the pre-amp transistor 223 converts voltage difference in the local bit line to discharging time difference because the pre-amp transistor 223 flows current ID1 as shown in FIG. 2B in exponential subthreshold region.

On the contrary, when the memory cell 210 stores data "0", the local bit line 221 keeps pre-charge voltage VL as shown V0. Thereby gate-source voltage is 0V (VGS=0V), which flows only low current ID0 through the local pre-amp transistor 223 and discharges the local pre-amp node 225 very slowly, such as thousand times slow. In doing so, bit line voltage is converted to current difference, and the current difference is converted to discharging time difference. And the discharging time difference between data "1" and data "0" is transferred to the global sense amp. For example, data "1" is transferred to the global sense amp in thousand times earlier than data "0". Thus, data "1" can be used as a reference signal for rejecting to be read data "0".

Referring now to FIG. 2C in view of FIG. 2A, waveform of the local bit line for reading data "1" is illustrated, wherein the local bit line (LBL) 221 is quickly charged to V1 voltage by raising the word line (WL) 211 to a predetermined voltage, only if the storage node of the selected memory cell stores high voltage data (data "1"). And the local pre-amp node (PM1) 224 is quickly discharged by charging the local bit line.

Referring now to FIG. 2D in view of FIG. 2A, waveform of the local bit line for reading data "0" is illustrated, wherein the local bit line (LBL) 221 is very slightly discharged to V0 voltage by raising the word line (WL) 211 to a predetermined voltage, only if the storage node of the selected memory cell stores low voltage data (data "0"). However the local pre-amp node (PM1) 224 is extremely slowly discharged by discharging the local bit line.

Referring now to FIG. 2E in view of FIG. 2A, detailed timing for reading data "1" is illustrated. To read data, the pre-charge (PR) signal 222A is de-asserted to low for releasing the local bit line 221, and then the word line 211 is raised to a predetermined voltage. By raising the word line, the local bit line (LBL) 221 is charged to V1 voltage from the pre-charge voltage VL, because the memory cell 210 stores high data, while the pre-set transistor 225 and the write transistor 228 are turned off, thus the local pre-amp transistor 223 is turned on, which discharges the pre-amp node (PM1) 224 to VL voltage from a pre-set voltage VDD.

By discharging the pre-amp node (PM1) 224, the local main-amp transistor 226 is turned on, which pulls up the global bit line (GBL) 231, while the local select transistor 227 is turned on, but the global pre-charge transistor 232 and the write drive transistor 249 are turned off. When the global bit line 231 is raised to VDD voltage from VL voltage, the global latch circuit 251 including inverters 255 and 256 is changed from the reset state by turning on the global main amp transistor 236 when the global select transistor 237 is also turned on, but the latch reset transistor 257 is turned off. And the latched high data in the global latch circuit 251 raises the common node 276 to high from reset state through column selector 258 and the read switch 274, so that the column selector signals 258A and 258B select 1 of 4 columns and the read switch 274 is selected by NAND gate output 266 and inverter output 266', while the receive switch 267 is turned off. And then, high data in the common node voltage 276 is transferred to the output node (DO) 287 through inverting buffers including 277, 281, 282, 283, 284 and 286.

After reading, write-back operation is executed, such that the read data in each global latch circuit is written back to each memory cell through each write transistor, when a write enable signal 228A is asserted to VDD or VDD+VT voltage. Or read-modify-write operation can be executed, where broken lines in the local bit line (LBL) 221 and the global bit line (GBL) 231 illustrate to modify from data "1" to data "0", so that the local bit line 221 and the storage node (not shown) is inverted by the modified data. After write-back operation, all the control signals including the pre-charge signal (PR) 222A, the word line, and other control signals, are returned to a pre-charge state or standby mode. And, during standby, the write line 264' keeps high for resetting the common node 276 to low, because the bypass tri-state inverter 273 is turned on, which prevents a conflict with low data in the global latch circuit 251 when reading. And the plate line (PL) 214 of the memory cell is supplied by half VDD voltage for reducing stress to the insulation layer of the capacitor.

Referring now to FIG. 2F in view of FIG. 2A, detailed timing for reading data "0" is illustrated, wherein the local bit line (LBL) 221 keeps VL voltage when the stored voltage in the memory cell is near VL voltage, which keeps the local pre-amp transistor 223 on turn-off state. Thereby, the global bit line 231 keeps the pre-charge state at VL voltage, which does not change the global latch circuit 251. And other read path keeps the pre-charge state. Hence the data output (DO) 287 keeps the pre-charge state at low. However, the local pre-amp node (PM1) 224 is very slowly discharged by turn-off current through the local pre-amp transistor 223. And the global bit line 231 can be charged by the turn-off current of the local main-amp transistor 226. The turn-off leakage current depends on transistor parameters, temperature and substrate voltage for the transistor. Hence, the global bit line 231 may be gradually pulled up, which may turn on the global pre-amp transistor 233 while the global select transistor 237 is enabled. For reducing turn-off current, long channel transistors can be used for the local pre-amp transistor 223, the local main-amp transistor 227, the global pre-amp transistor 233 and the global main-amp transistor 236, while the local pre-charge transistor 222, the local pre-set transistor 225, the global pre-charge transistor 232 and the global pre-set transistor 235 can be composed of relatively short channel transistor, which helps to keep the pre-charge state when reading data "0", alternatively. In order to avoid the false flip with the leakage current when reading data "0", the global select transistor 237 is turned off by the locking signal 295 which is generated by locking signal generator 290 receiving fast data (data "1") with delay time as shown TD, so that data "0" is rejected to be latched to the global latch circuit because the false flip is very slowly occurred. This means that the global latch circuit 251 keeps the reset state when reading data "0", such that this operation is called locking with the locking signal 295. After reading data "0", the write-back operation is executed by asserting the write enable signal 228A. And then, all the control signals including the word line, the write enable signal and others are returned to the pre-charge state or standby mode.

In this manner, the locking signal 295 effectively differentiates high data and low data where the memory block 200 and 280 serve as reference memory blocks storing data "1" while main memory blocks 200' and 280' store main data, so that this sensing scheme is called "time domain sensing scheme", which can differentiate high data and low data within a pre-determined time domain even though the leakage current is relatively high. Thereby, data "1" in the memory cell 210 is quickly transferred to the global latch circuit 251 through the local sense amp with high gain, which generates the locking signal, but data "0" is not transferred with low gain, thus the locking signal effectively rejects data "0" not to be latched. In other words, fast cycle memory (with no page mode) does not require the locking signal which is generated by the reference signal based on reference cells storing data "1", because data "0" is not reached to the latch within a short cycle. Thus, an enable signal from a control circuit is used to control the global select transistor 237 for fast cycle operation, which does not require reference cells and related circuits. And by applying multi-divided bit line architecture, fast read operation and write operation are realized. And also the memory cell can be reduced, because the memory cell drives only lightly loaded bit line, which means that the capacitor can be reduced for realizing very high density memory.

In FIG. 2G, simulated waveforms are illustrated when reading data "1", wherein stored charges in the storage node (SN) is re-distributed with charges in the local bit line after the word line (WL) 211 is asserted to a pre-determined voltage. The local bit line (LBL) 221 is raised to V1 voltage from VL voltage, by positive charges in the storage node for data "1" (D1). For enabling the sense amps, read enable signal (RE) 227A is asserted to low. Hence, the local pre-amp node (PM1) 224 is discharged by raising the local bit line 221 to V1 voltage, when V1 voltage is near threshold voltage of the local pre-amp transistor. By discharging the local pre-amp node 224, the global bit line (GBL) 231 is raised, which discharges the global pre-amp node (PM2) 234. And the latch node (LAT) 250 in the global latch circuit is changed by discharging the global pre-amp node (PM2) 234. After changing the latch node, the locking signal is generated, which locks the local sense amp and the global sense amp. And then, the write enable (WE) signal 228A is asserted for the write-back operation, which restores the read data or modifies an inverted data to the storage node (SN) of the memory cell.

In FIG. 2H, simulated waveforms are illustrated when reading data "0", wherein the local bit line (LBL) 221 is slightly lowered to V0 voltage from VL voltage, by negative charges in the storage node for data "0" (D0) because leakage current lowers the storage node to lower than VL voltage with reverse biased body. For enabling the sense amps, read enable signal (RE) 227A is asserted to low. However, the local pre-amp node (PM1) 224 is not discharged because the local pre-amp transistor 223 is turned off. Thus, the global bit line (GBL) 231 is not changed. And the latch node (LAT) 250 in the global latch circuit is not changed either. After then, locking operation and write-back operation are executed as reading data "1" similarly.

Figure 3A:
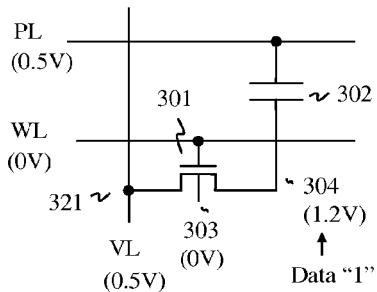
FIG. 3A illustrates a simplified schematic when storing data "1"
Figure 3B:
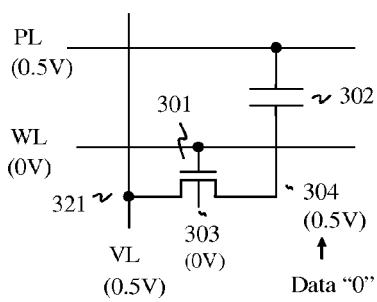
FIG. 3B illustrates a simplified schematic when storing data "0"
Figure 3C:
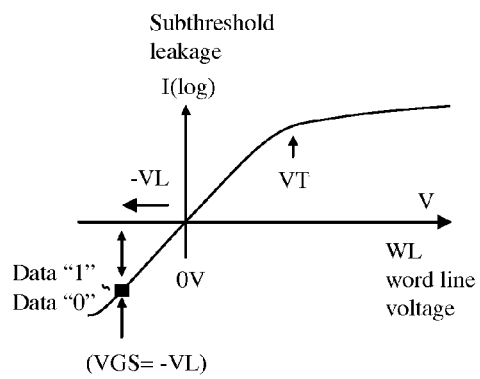
FIG. 3C illustrates subthreshold leakage current curve for the memory cell, according to the teachings of the present invention.

In FIG. 3A, a simplified schematic when storing data "1" is illustrated for explaining pseudo negative word line scheme during standby, wherein the word line (WL) of the memory cell is asserted to low, the local bit line 321 is pre-charged to VL voltage, for example, 0.5V, and the storage node 304 is charged to VDD voltage (1.2V), when storing data "1". Thus, gate-to-source voltage of the pass transistor 301 is negative 0.5V, even though the word line is forced to ground voltage. And, when storing data "0" as shown in FIG. 3B, gate-to-source voltage of the pass transistor 301 is negative 0.5V as well, while the storage node 304 is charged to VL voltage, 0.5V, and the local bit line is also charged to VL voltage. In FIG. 3C, subthreshold leakage current curve for the pass transistor 301 is illustrated, wherein the word line voltage (WL) is negative VL voltage when storing data during standby. As a result, subthreshold leakage current through the pass transistor is exponentially reduced in exponential subthreshold region. Hence, retention time of the present invention is longer than that of the conventional DRAM including 30fF big capacitor, even though the storage capacitor is reduced to 1fF from 30fF. Furthermore, the body 303 of the pass transistor is forced to ground voltage. On the contrary, the body is forced to negative voltage in the conventional DRAM. With ground body potential, reverse bias leakage current is dramatically reduced in exponential reverse bias region as well.

Figure 4A:
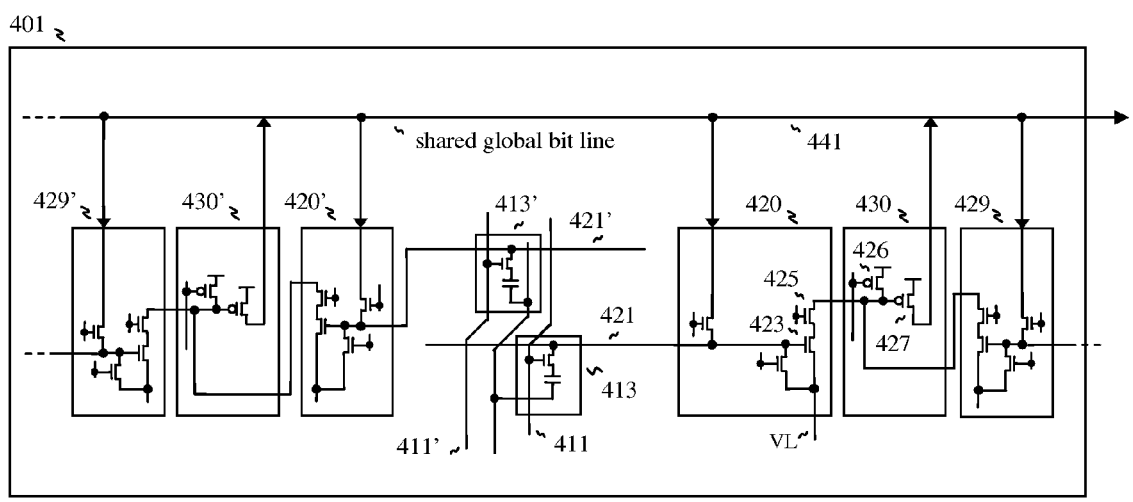
FIGS. 4A and 4B illustrate alternative array configuration for implementing folded bit line, according to the teachings of the present invention.

In FIG. 4A, alternative array configuration 401 for implementing folded bit line is illustrated. In the folded bit line, a right word line 411 is connected to the right memory cell 413 and a left word line 411' is connected to the left memory cell 413', and the global bit line 441 is shared with the right local sense amp and the left local sense amp because one of word lines 411 and 411' is selected when reading. For activating the pre amplifier 420 and the main amplifier 430, a select transistor 425 of the pre amplifier 420 is turned on for transferring output of the local pre-amp transistor 423. Hence, output of the pre amplifier 420 is transferred to the main amplifier 430 which is composed of a local main-amp transistor 427 and the local pre-set transistor 426, while unselected pre amplifier 429 is de-activated. And the main amplifier 430 is shared by adjacent pre amplifier 429 for reducing area. And left sense amps including the pre amplifier 420', the pre amplifier 429' and the main amplifier 430' are not selected. However, the folded bit line occupies additional space with passing word line, while coupling noise between the local bit lines is minimized.

Figure 4B:
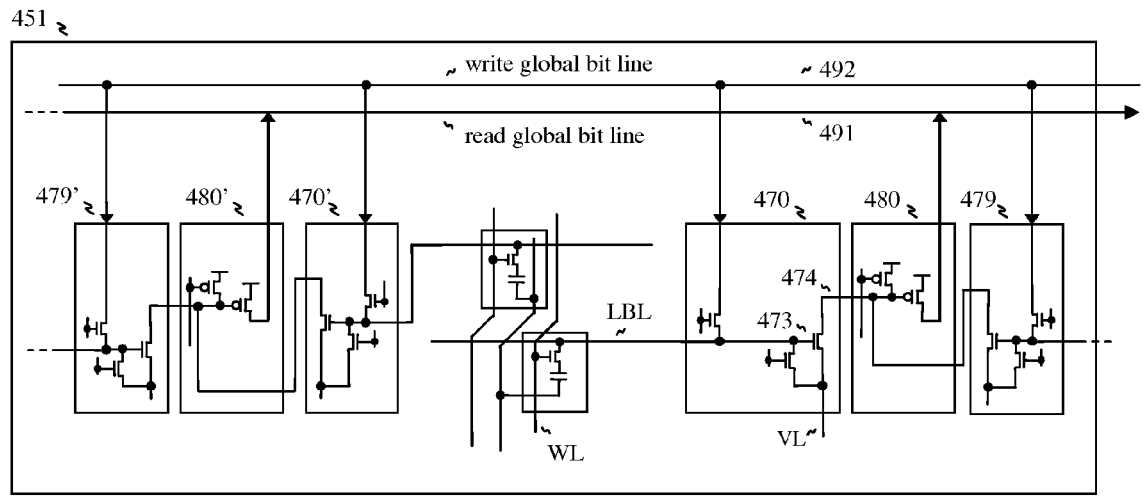

In FIG. 4B, another alternative array configuration 451 for implementing folded bit line is illustrated. In the configuration, the local pre-amp transistor 473 of the local pre-amp 470 is directly connected to the local main amp 480 through the local pre-amp node 474 for reducing area and control signal. And read global bit line 491 is connected to the local main-amp 480 and 480', while write global bit line 492 is separately connected to the local pre-amp 470, 479, 470' and 479', because the local pre-amp node 474 can not be pre-set after it is discharged when reading data "1", so that the read global bit line can not be shared for writing. And other operations are the same as those of FIG. 4A.

Figure 5A:
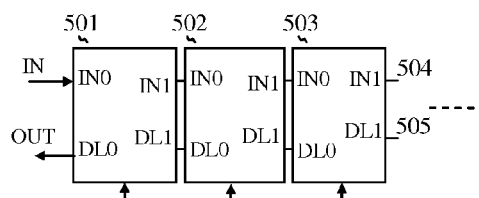
FIG. 5A illustrates a tunable delay circuit.
Figure 5B:
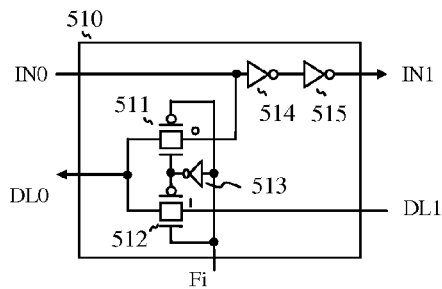
FIG. 5B illustrates a delay unit of the tunable delay circuit.

In FIG. 5A, more detailed a tunable delay circuit (as shown 292 in FIG. 2A) is illustrated, wherein multiple delay units 501, 502 and 503 are connected in series, the first delay unit 501 receives input IN and generates output OUT, the second delay unit 502 is connected to the first delay unit, and the third delay unit 503 is connected to the second delay unit 502 and generates outputs 504 and 505, and so on. Each delay unit receives a fuse signal, such that the first delay unit receives F0, the second delay unit receives F1, and a third delay unit receives F2. And more detailed delay unit is illustrated in FIG. 5B, wherein the delay unit 510 receives an input IN0 and a fuse signal Fi, thus the fuse signal Fi selects output from the input IN0 or input DL1, so that a transfer gate 511 is turned on when the fuse signal Fi is low and output of inverter 513 is high, otherwise another transfer gate 512 is turned on when the fuse signal Fi is high and output of inverter 513 is low to bypass DL1 signal. Inverter chain 514 and 515 delays IN0 signal for the next delay unit, where more inverter chains or capacitors can be added for the delay even though the drawing illustrates only two inverters.

Figure 5C:
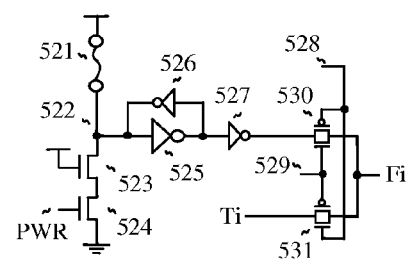
FIG. 5C illustrates a related fuse circuit for the tunable delay circuit, according to the teachings of the present invention.

In FIG. 5C, a related fuse circuit of the tunable delay circuit (as shown in FIG. 5A) is illustrated in order to store information for the delay circuit, so that a fuse serves as a nonvolatile memory, wherein a fuse 521 is connected to a latch node 522, a cross coupled latch including two inverters 525 and 526 are connected to the latch node 522, pull-down transistors 523 and 524 are serially connected to the latch node 522 for power-up reset. Transfer gate 530 is selected by a select signal 529 (high) and another select signal 528 (low) in order to bypass the latch node output 522 through inverter 525 and 527. In doing so, fuse data is transferred to output node Fi, otherwise test input Ti is transferred to Fi when a transmission gate 531 is turned on.

Figure 6C:
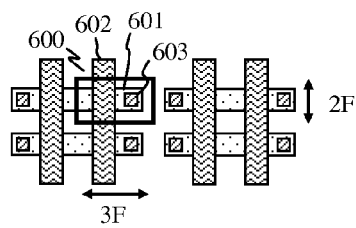
Figure 6C:
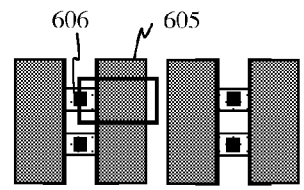
Figure 6B:
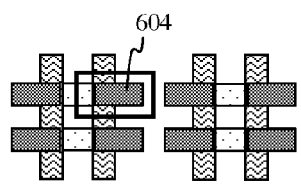
Figure 6D:
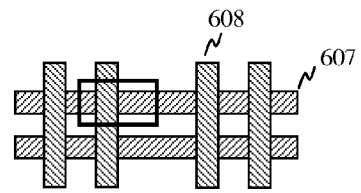

In FIGS. 6A, 6B, 6C and 6D, an example layout for configuring an open bit line memory cell array is illustrated. A solid line 600 depicts a memory cell. In the process steps, the active region 601 is formed first, and gate oxide (not shown) is formed on the active region, then gate poly 602 is formed on the gate oxide region. After then capacitor contact region 603 is formed as shown in FIG. 6A. Then, a storage node 604 is formed on the capacitor contact region 603 as shown in FIG. 6B. After forming the storage node (bottom plate) 604, an insulation layer (not shown) is formed on the storage node 604. Then, a capacitor plate (top plate) 605 is formed on the storage node 604 as shown in FIG. 6C. After then, contact region 606 is formed. In FIG. 6D, a first metal layer 607 for the local bit line is formed on the contact region 606 (in FIG. 6C). And a second metal layer 608 for global word line is formed on the first metal layer 607, as shown in FIG. 6D. In this open bit line structure, one word line is used to control a memory cell with no passing word line, which makes a straight word line in shape. Hence, the open bit line structure occupies 6F.sup.2 in general, which minimizes chip area. Furthermore, half of row decoders are reduced with no passing word line, which reduces chip area as well.

Figure 6E:
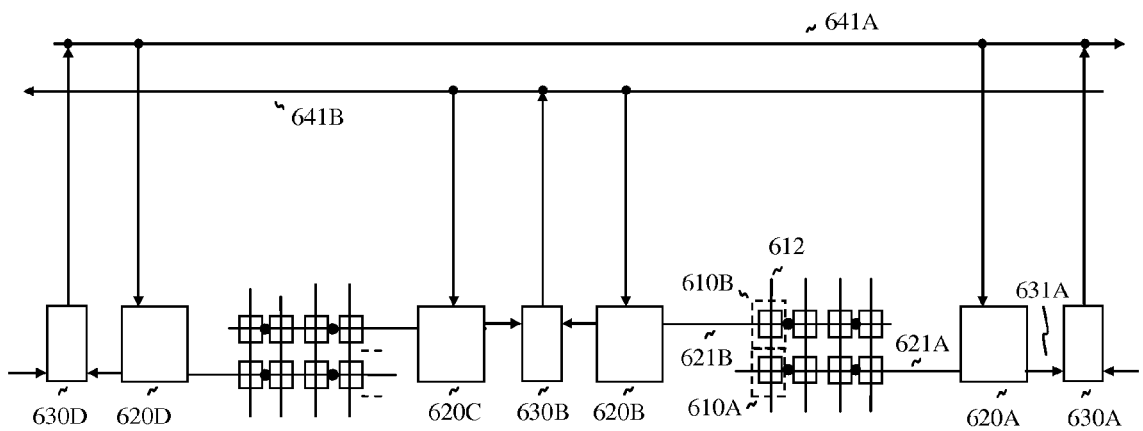
FIG. 6E illustrates a block diagram for implementing the open bit line architecture, according to the teachings of the present invention.

More detailed array configuration is illustrated in FIG. 6E, wherein a memory cell 610A is connected to the local bit line 621A which is connected to the local sense amp 620A to read the memory cell with a word line 612, and the global bit line 641A is connected to the local bit line 617 through write transistor (not shown) of the local sense amp 620A. And other memory cell 610B is connected to the local bit line 621B which is connected to the local sense amp 620B to read data with the same word line 612. When reading data, the word line 612 is asserted to a predetermined voltage. Thus, the read output from the memory cell 610A is transferred to the segment sense amp 630A through the local sense amp 620A and the pre-amp node 631A, and another read output from the memory cell 610B is transferred to the segment sense amp 630B through the local sense amp 620B, while other local sense amps 620C and 620D, and other segment sense amp 630D are not activated. The output is transferred to block sense amp (not shown) through the global bit line 641A for the memory cell 610A and another global bit line 641B for the memory cell 610B.

In FIGS. 7A, 7B and 7C, example layout for the local sense amp 720 is illustrated, wherein the local sense amp 720 includes poly gate 722 as the local pre-charge transistor, poly gate 728 as the write transistor, poly gate 723 as the local pre-amp transistor, poly gate 725 as the pre-set transistor, poly gate 726 as the local main-amp transistor, and poly gate 727 as the local select transistor. The local pre-charge transistor and the local pre-amp transistor are connected to the pre-charge voltage VL. NMOS transistors 722, 723 and 728 are composed of n+ active region on p-well region (PW), and PMOS transistors 725, 726 and 727 are composed of p+ active region on n-well region (NW), as shown in FIG. 7A. And metal-1 (M1) region and via-1 (VA1) region are defined as shown in FIG. 7B, such that metal-1 local bit line 721 is connected to the local pre-charge transistor 722 and the local pre-amp transistor 723 (in FIG. 7A), and metal-1 region 724 serves as the pre-amp node. And in FIG. 7C, metal-2 (M2) region is defined, such that the global bit line 731 is connected to the write transistor 728 through via-1 (VA1) and metal-1 (M1) region, and also connected to output node of the local main-amp transistor 727 through via-1 (VA1) and metal-1 (M1) region, where the local select signal 727A is connected to the gate of the local select transistor 727.

In FIG. 7D, an equivalent circuit of the local sense amp 720 is illustrated, wherein the local sense amp 720 includes the local pre-charge transistor 722, the write transistor 728, the local pre-amp transistor 723, the local pre-set transistor 725 connecting to the local pre-amp node 724, the local main-amp transistor 726, and the local select transistor 727. A memory cell 710 is connected to a local bit line 721, and another memory cell is connected to another local bit line, where node numbers are the same as FIG. 7A to 7C for ease of understanding.

In FIGS. 8A, 8B, 8C and 8D, example layout for the local sense amp 820 including a PMOS write transistor is illustrated, wherein the local sense amp 820 includes poly gate 822 as the local pre-charge transistor, poly gate 823 as the local pre-amp transistor, poly gate 828 as the PMOS write transistor, poly gate 825 as the local pre-set transistor, poly gate 826 as the local main-amp transistor, and poly gate 827 as the local select transistor. The local pre-charge transistor and the local pre-amp transistor are connected to the pre-charge voltage VL. NMOS transistors 822 and 823 are composed of n+ active region on p-well region (PW), and PMOS transistors 825, 826, 827 and 828 are composed of p+ active region on n-well region (NW), as shown in FIG. 8A. And metal-1 (M1) region and via-1 (VA1) region are defined as shown in FIG. 8B, such that metal-1 bit line 821 is connected to the local pre-charge transistor 822 and the local pre-amp transistor 823 (in FIG. 8A), and metal-1 region 824 serves as the local pre-amp node which is shared by adjacent local sense amp in the right side (not shown). And in FIG. 8C, metal-2 (M2) region is defined, such that the local bit line 821 is jumped over the pre-charge line VL (in FIG. 8B), and the global bit line 831 is connected to the PMOS write transistor 828 through the metal-2 (M2) region. And the local select signal 827A is connected to the gate of the local select transistor 827. In FIG. 8D, metal-3 region as the global bit line 831 are defined for connecting to drain node of the write transistor 828 and drain node of the local select transistor 827 via metal-2 and other layers.

In FIG. 8E, an equivalent circuit of the local sense amp 820 is illustrated, wherein the local sense amp 820 includes the PMOS write transistor 828, the local pre-charge transistor 822, the local pre-amp transistor 823, the local pre-set transistor 825 connecting to the local pre-amp node 824, the local main-amp transistor 826, and the local select transistor 827. A memory cell 810 is connected to the (right) local bit line 821, and another memory cell is connected to the (left) local bit line, where node numbers are the same as FIG. 8A to 8D for ease of understanding.

Methods of Fabrication

The memory cells can be formed from single crystal silicon as the conventional DRAM cell. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. Nos. 5,395,804, 6,852,577 and 6,951,793. The LTPS has been developed for the low temperature process (around 500 centigrade) on the glass in order to apply the display panel. Now the LTPS can be also used as a thin film polysilicon transistor for the memory device. The thin film based transistor can drive multi-divided bit line which is lightly loaded, even though thin film polysilicon transistor can flow less current than single crystal silicon based transistor on the surface of the wafer, for example, 10-20 times weaker than that of conventional transistor, as published, "Poly-Si Thin-Film Transistors: An Efficient and Low-Cost Option for Digital Operation", IEEE Transactions on Electron Devices, Vol. 54, No. 11, November 2007, and "A Novel Blocking Technology for Improving the Short-Channel Effects in Polycrystalline Silicon TFT Devices", IEEE Transactions on Electron Devices, Vol. 54, No. 12, December 2007. During LTPS process, the MOS transistor in the control circuit and routing metal are not degraded. And the steps in the process flow should be compatible with the current CMOS manufacturing environment as published, U.S. Pat. Nos. 6,710,391, 7,368,343 and No. 7,265,051 for forming DRAM memory cell. And forming the thin film transistor is similar to TFT (thin film transistor) SRAM, as published, U.S. Pat. No. 6,670,642. In this respect, detailed manufacturing processes for forming the memory cell, such as width, length, thickness, temperature, forming method, or any other material related data, are not described in the present invention.

Figure 9:
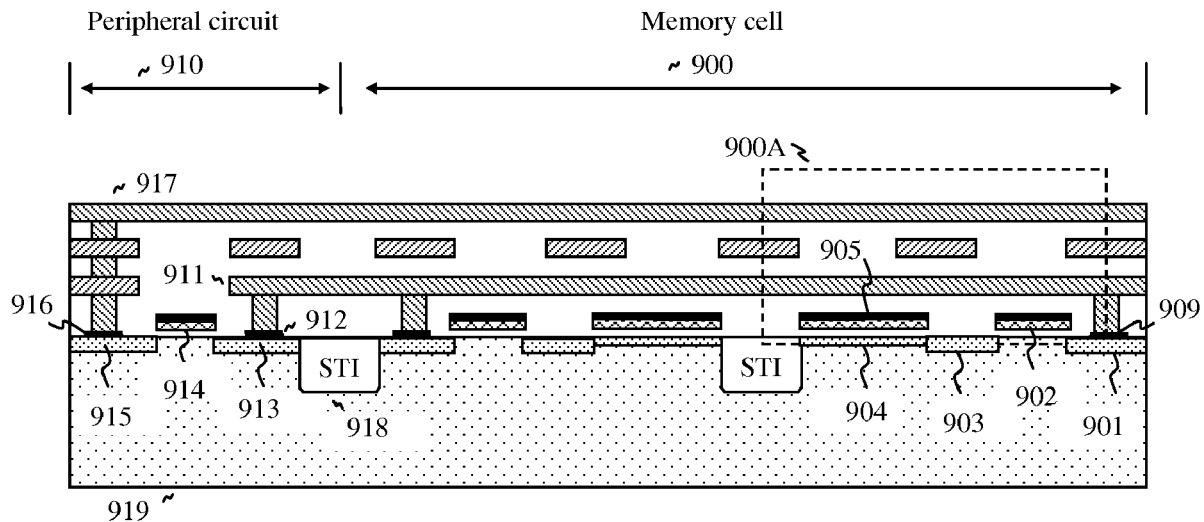
FIG. 9 illustrates a cross sectional view of the memory cell with a MOS capacitor, according to the teachings of the present invention.

In FIG. 9, an example cross sectional view of a memory cell structure for implementing high density DRAM as the present invention is illustrated, wherein memory cell region 900 shows a memory cell 900A. The memory cell 900A is composed of a pass transistor and a capacitor, wherein the capacitor is composed of a gate 905 as a top plate, and inversion or implant region 904 as a bottom plate, and the pass transistor includes a gate region 902, drain/source regions 901 and 903, the drain/source region 901 is connected to the local bit line 911 through contact region 909. The pass transistor is connected to the bottom plate of the capacitor. And the local bit line 911 is connected to a write transistor 914 through a contact region 912, wherein the write transistor in peripheral circuit region 910 is composed of a gate 914, drain/source regions 913 and 915. The drain/source region 915 is connected to the global bit line 917 through a contact region 916. The transistors are separated by STI (shallow trench isolation) region 918. And the transistors are formed on the substrate region 919.

Figure 10A:
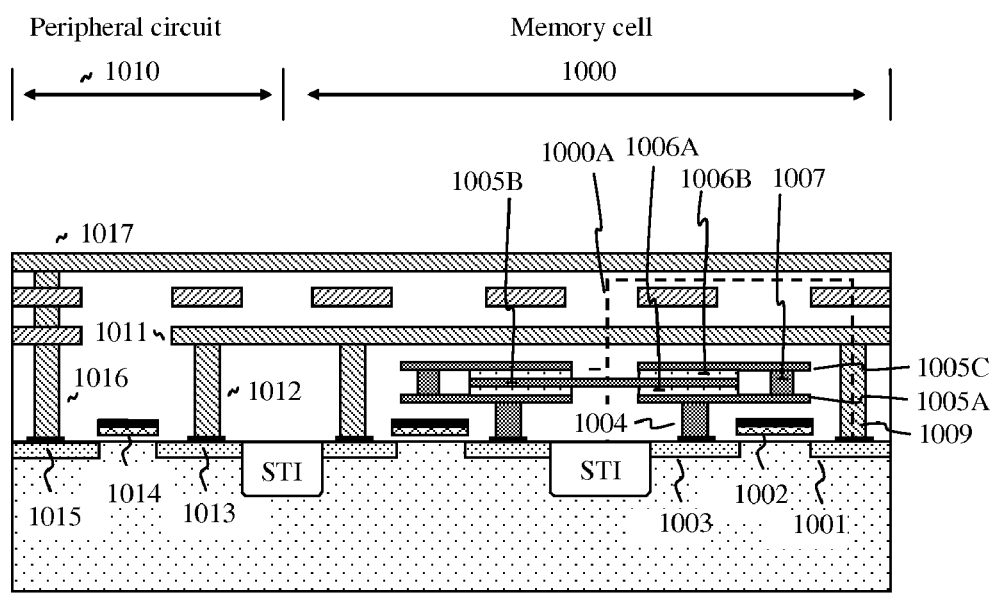
FIGS. 10A, 10B, 10C and 10D illustrate alternative memory cell structures including fingered shape capacitor.

In FIG. 10A, alternative cross sectional view of a memory cell structure with fingered shape capacitor is illustrated, memory cell region 1000 includes a memory cell 1000A. The memory cell 1000A is composed of a pass transistor and a capacitor, wherein the capacitor is composed of a first plate 1005A, a second plate 1005B and a third plate 1005C, which configure fingered shape capacitor with a first insulation layer 1006A and a second insulation layer 1006B. The first plate 1005A and the third plate 1005C are connected to a contact region 1007. And the pass transistor includes a gate region 1002, drain/source regions 1001 and 1003, and the drain/source region 1001 is connected to the local bit line 1011 through contact region 1009. The pass transistor is connected to the bottom plate of the capacitor. And the local bit line 1011 is connected to a write transistor 1014 through a contact region 1012, wherein the write transistor in peripheral circuit region 1010 is composed of a gate 1014, drain/source regions 1013 and 1015. The drain/source region 1015 is connected to the global bit line 1017 through a contact region 1016.

And various capacitors can be used as the storage capacitor. For example, PIP (Polysilicon Insulator Polysilicon) capacitor structure and MIM (Metal Insulator Metal) capacitor structure can be used for forming the capacitor. Forming PIP capacitor and MIM capacitor is similar to the conventional method as published, "MIM Capacitor Integration for Mixed-Signal/RF Applications", IEEE Transactions on Electron Devices, Vol. 52, No. 7, June 2005. The capacitance value is determined by the thickness and dielectric material. Furthermore, various dielectric materials can be used, such as silicon dioxide, silicon nitride, Ta2O5, TiO2, Al2O3, TiN/HfO2/TiN(TIT), and Ru/Insulator/TiN(RIT).

Figure 10B:
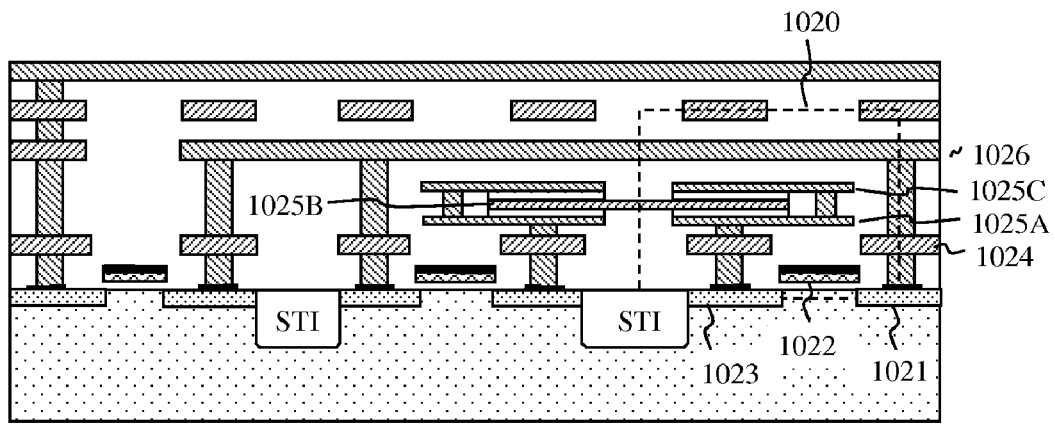

In FIG. 10B, an alternative memory cell structure is illustrated, wherein the memory cell 1020 is composed of a pass transistor including gate 1022, drain/source 1021 and 1023, and a capacitor including fingered shape plates 1025A, 1025B and 1025C. In particular, the capacitor is formed in between a first routing layer 1024 and a local bit line 1026, so that the depth of the bit line contact is shallower. And other layers are the same as FIG. 10A, and one more routing layer is added.

Figure 10C:
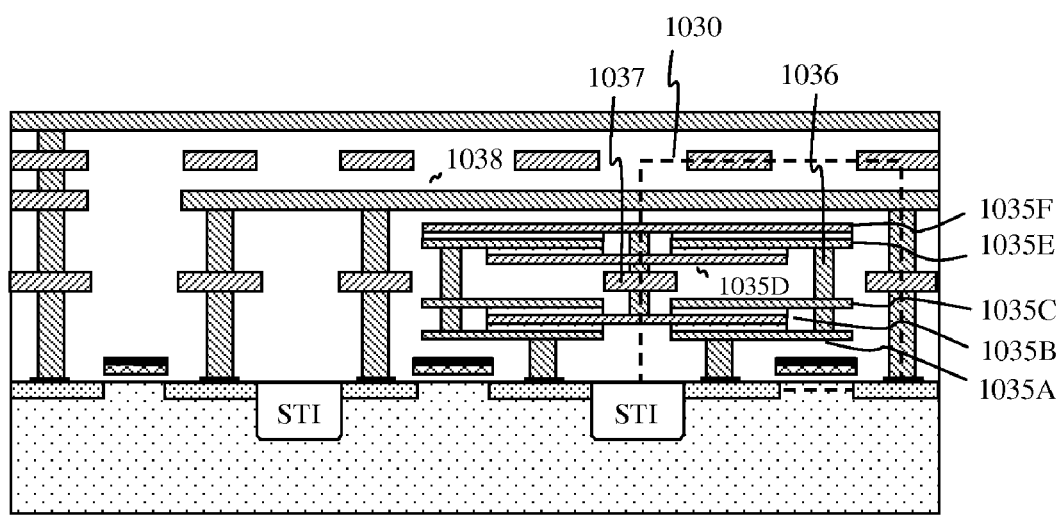

In FIG. 10C, an alternative memory cell structure for using more fingers is illustrated, wherein the memory cell 1030 is composed of a pass transistor including gate 1032, drain/source 1031 and 1033, and a capacitor including fingered shape plates 1035A, 1035B, 1035C, 1035E and 1035F. In particular, two capacitors are formed such that a first capacitor is composed of plates 1035A, 1035B and 1035C, and a second capacitor is composed of plates 1035D, 1035E and 1035F. The first capacitor is formed under the first metal layer 1037, and the second capacitor is formed in between the first routing layer 1037 and a local bit line 1038. Hence, more capacitance is obtained within a given space. And other layers are the same as FIG. 10A.

Figure 10D:
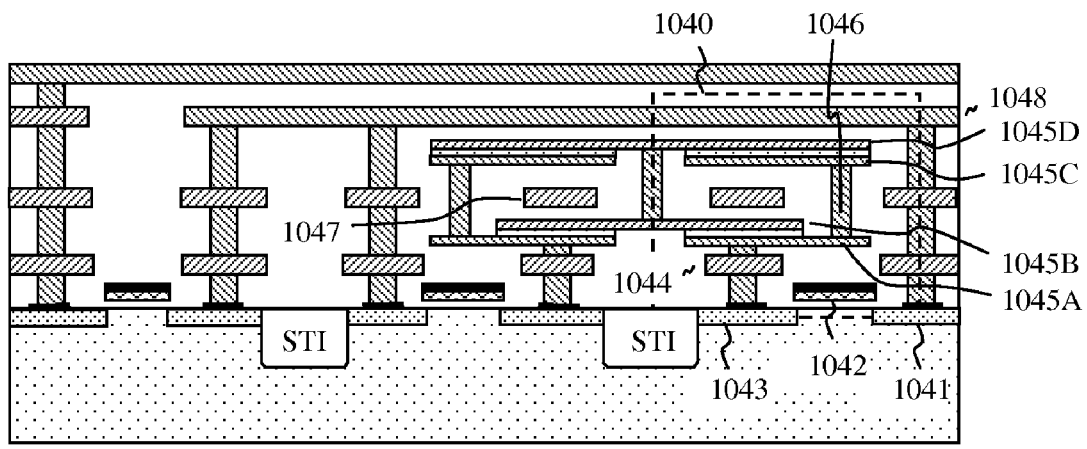

In FIG. 10D, an alternative memory cell structure for reducing contact depth is illustrated, wherein the memory cell 1040 is composed of a pass transistor including gate 1042, drain/source 1041 and 1043, and a capacitor including fingered shape plates. A first capacitor including plates 1045A and 1045B is formed in between a first routing layer 1044 and a second routing layer 1047, and a second capacitor including plates 1045C and 1045D is formed in between the second routing layer 1047 and a third routing layer 1048, where a cell contact 1046 is used for connecting two capacitors. The second routing layer 1047 serves as the global word line, and the third routing layer 1048 serves the local bit line. Forming the first capacitor over the first routing layer, contact depth between the routing layers is reduced, compared with that of FIG. 10C.

Figure 10E:
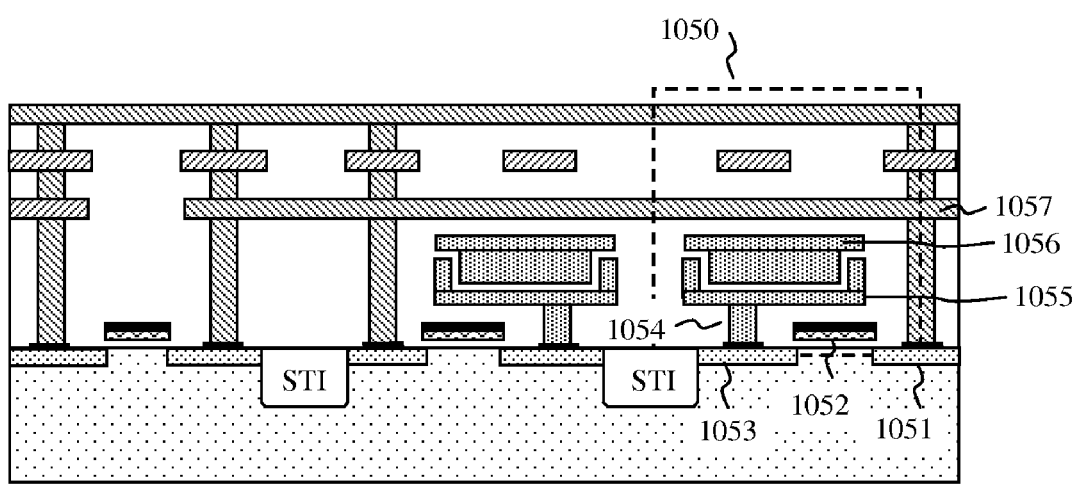
FIG. 10E illustrates memory cell structure including cup-like shape capacitor.

In FIG. 10E, an alternative memory cell structure for using a reduced cup-like capacitor is illustrated. In stead of extra large cup, small or medium cup is useful for configuring the memory cell, wherein the memory cell 1050 is composed of a pass transistor including gate 1052, drain/source 1051 and 1053, and the capacitor including a reduced cup-like shape within a given area, such that the reduced cup-like capacitor including lower plate 1055 and upper plate 1056 is formed. And the capacitor is connected to the pass transistor through a contact region 1054.

Figure 10F:
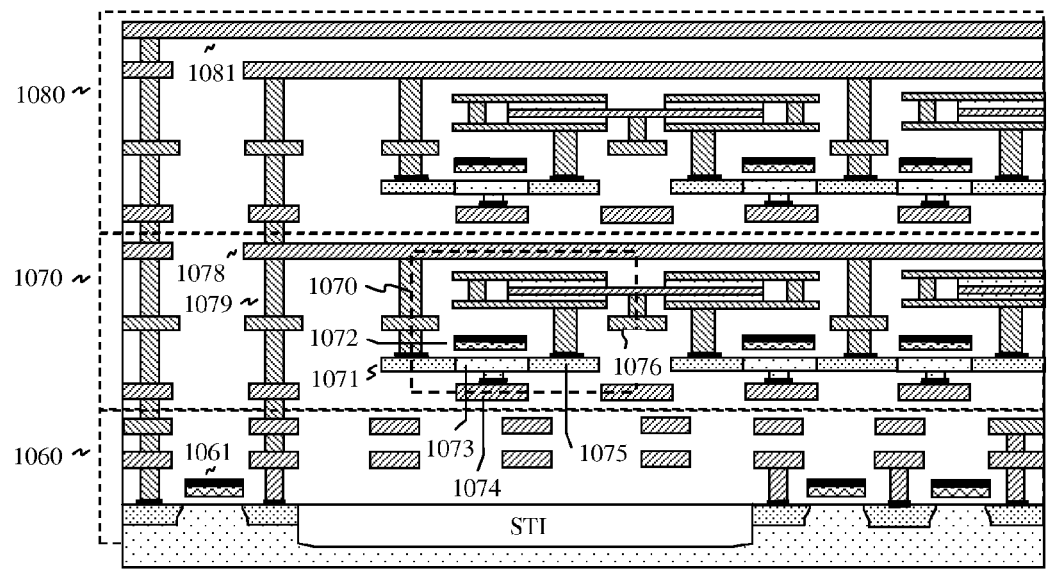
FIG. 10F illustrates stacked type memory cell structure as alternative configuration, according to the teachings of the present invention.

In FIG. 10F, stacked memory cell structure is illustrated as an example, wherein memory cells in the second floor 1070 are formed on the control circuit region 1060, and memory cells in third floor 1080 are formed on the second floor, wherein the pass transistors of the memory cell is composed of thin film transistor including LTPS (low temperature polycrystalline silicon) layer. The memory cells are connected to local bit line including metal region 1078 and contact region 1079, and the local bit line is connected to a write transistor 1061. And the write transistor 1061 is connected to the global bit line 1081. The plate line 1076 is connected to the capacitor. The memory cell 1070 is composed of the pass transistor 1072 including drain/source regions 1071 and 1075, and a body region 1073. In particular, the body region 1073 is connected to a metal bias line 1074 from bottom. As shown in the figure, the memory cell includes thin film transistor as a pass transistor with body-tied structure for alleviating self-heating problem in thin film transistor. Furthermore, biasing the body, sub-threshold leakage current is reduced for the pass transistor. Furthermore, thin film layer is formed from single crystal silicon, poly crystalline silicon, silicon-germanium and germanium.

Figure 11A:
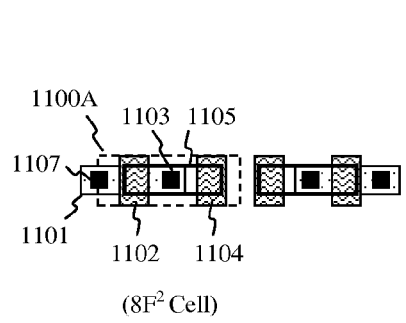
FIG. 11A illustrates a top view of folded bit line cell array.

In FIG. 11A, an example layout for folded bit line array is illustrated as an alternative configuration, wherein the memory cell 1100A includes a pass transistor having a poly gate 1102 and drain/source regions 1101 and 1103, a storage plate region 1105, a bit line contact 1107 and a passing word line 1104. Thus, the area of the memory cell occupies 8F.sup.2 with the passing word line 1104.

Figure 11B:
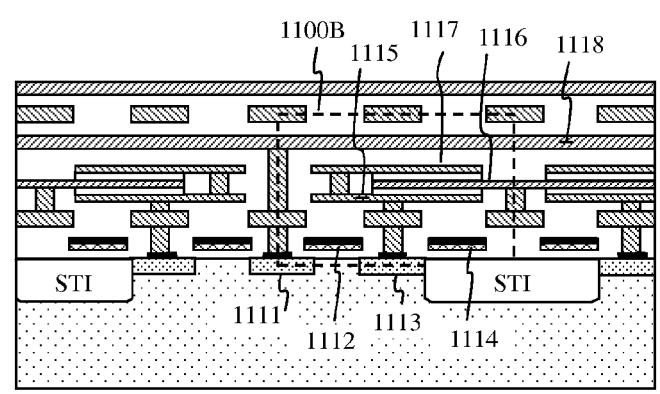
FIGS. 11B and 11C illustrate example cross sectional views of folded bit line cell array with the fingered shape capacitor, according to the teachings of the present invention.

In FIG. 11B, a related cell structure for the folded bit line array is illustrated, wherein the memory cell 1100B is composed of the pass transistor including gate region 1112, drain/source regions 1111 and 1113, and the capacitor including fingered shape plates including 1115, 1116 and 1117. And the passing word line is shown in 1114 on STI (shallow trench isolation) region.

Figure 11C:
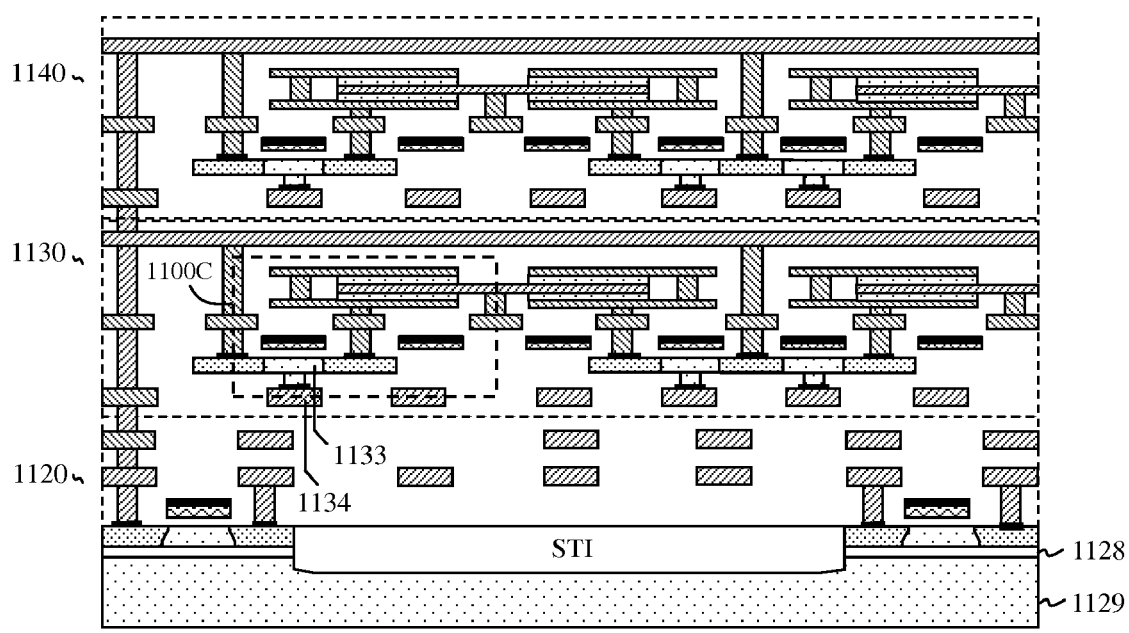

In FIG. 11C, alternative memory cell structure including stacked memory cells with folded bit line is shown, wherein memory cell 1100C in the second floor 1130 is stacked over on a peripheral circuit region 1120. And the memory cell structure is the same as that of FIG. 11B except thin film pass transistor as the pass transistor, where the body 1133 of the pass transistor is biased by metal line 1134. And memory cell in the third floor 1140 is stacked over the second floor 1130. And the peripheral circuit can be formed on SOI (Silicon-on-Insulator) wafer 1129 where BOX (buried oxide) region 1128 serves as an insulation region.

While the descriptions here have been given for configuring the memory circuit and structure, alternative embodiments would work equally well with reverse configuration, such that PMOS transistor can be used as the pass transistor. Other circuits including the local sense amp and the global sense amp are reversed. And signal polarities are also reversed to control the reverse configuration such that the first reduced swing amplifier is limited to swing from ground voltage to a pre-determined voltage.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:

a memory cell including a pass transistor and a capacitor; and a local sense amp including a first reduced swing amplifier and a write transistor, wherein the first reduced swing amplifier is used for limiting voltage swing of a local bit line connecting to the memory cell from a pre-charge voltage to a supply voltage, such that the first reduced swing amplifier is composed of a local pre amplifier and a local main amplifier, the local pre amplifier includes a local pre-charge transistor for pre-charging the local bit line to the pre-charge voltage, a local pre-amp transistor for detecting whether the local bit line is higher than the pre-charge voltage or not; and the local main amplifier includes a local pre-set transistor for pre-setting a local pre-amp node connecting to the local pre-amp transistor, a local main-amp transistor connecting to the local pre-amp node for driving a global bit line through a local select transistor; and the write transistor is connected to the local bit line for receiving a voltage output of the global bit line; and a global sense amp including a global read circuit, a global write circuit, a global latch circuit, a data transfer circuit and a data receive circuit, wherein the global read circuit is composed of a second reduced swing amplifier for limiting voltage swing of the global bit line, such that the second reduced swing amplifier is composed of a global pre amplifier and a global main amplifier, the global pre amplifier includes a global pre-charge transistor for pre-charging the global bit line to the pre-charge voltage, a global pre-amp transistor for detecting whether the global bit line is higher than the pre-charge voltage or not; and the global main amplifier includes a global pre-set transistor for pre-setting a global pre-amp node connecting to the global pre-amp transistor, a global main-amp transistor connecting to the global pre-amp node, and a global select transistor connecting to the global main-amp transistor serially; and the global write circuit is composed of a reduced swing write driver for driving the global bit line to the pre-charge voltage when writing data "0" and the supply voltage when writing data "1"; and the global latch circuit is connected to the global read circuit and the global write circuit; and the data transfer circuit receives a read output from the global latch circuit and transfers to a read line; and the data receive circuit receives a write input from a write line and sends to the global latch circuit; and a locking signal generator for locking the global select transistor of the global read circuit, wherein the locking signal generator includes a tunable delay circuit receiving an output from the global latch circuit.

2. The memory device of claim 1, wherein the first reduced swing amplifier is composed of the local pre amplifier including the local pre-charge transistor for pre-charging the local bit line to the pre-charge voltage, the local pre-amp transistor for detecting whether the local bit line is higher than the pre-charge voltage or not; and the local main amplifier including the local pre-set transistor for pre-setting the local pre-amp node connecting to the local pre-amp transistor through a select transistor, the local main-amp transistor connecting to the local pre-amp node for driving the global bit line.

3. The memory device of claim 1, wherein the first reduced swing amplifier is composed of the local pre amplifier including the local pre-charge transistor for pre-charging the local bit line to the pre-charge voltage, the local pre-amp transistor for detecting whether the local bit line is higher than the pre-charge voltage or not; and the local main amplifier including the local pre-set transistor for pre-setting the local pre-amp node connecting to the local pre-amp transistor, the local main-amp transistor connecting to the local pre-amp node for driving the global bit line.

4. The memory device of claim 1, wherein the first reduced swing amplifier is reversely configured in polarity for limiting voltage swing from ground voltage to the pre-determined voltage, such that the first reduced swing amplifier is composed of the local pre amplifier including the local pre-charge transistor for pre-charging the local bit line to the predetermined voltage, the local pre-amp transistor for detecting whether the local bit line is lower than the pre-determined or not; and the local main amplifier including the local pre-set transistor for pre-setting the local pre-amp node connecting to the local pre-amp transistor through a pre-amp select transistor, the local main-amp transistor connecting to the local pre-amp node for driving the global bit line; and the second reduced swing amplifier is reversely configured.

5. The memory device of claim 1, wherein the local pre-amp transistor and the local main-amp transistor are composed of longer channel length transistor than that of the local pre-charge transistor and the pre-set transistor, for reducing power consumption.

6. The memory device of claim 1, wherein the local pre-amp transistor and the local main-amp transistor are composed of low threshold MOS transistor, for realizing high speed operation.

7. The memory device of claim 1, wherein the write transistor is composed of a MOS transistor, such as an NMOS transistor and a PMOS transistor.

8. The memory device of claim 1, wherein the global sense amp includes the global read circuit, the global write circuit, the global latch circuit, the data transfer circuit and the data receive circuit, such that the global read circuit is composed of the global pre amplifier and the global main amplifier, the global latch circuit includes a cross coupled inverter latch and a latch reset transistor, the global write circuit includes a reduced swing inverter and a write drive transistor, the data transfer circuit includes a read selector, a bypass tri-state inverter, a common reset transistor and a read inverter, and the data receive circuit includes a receive control circuit and a receive switch.

9. The memory device of claim 1, wherein the global sense amp includes the global read circuit, the global latch circuit, the global write circuit, the data transfer circuit and the data receive circuit, such that the global read circuit is composed of the global pre amplifier and the global main amplifier, the global latch circuit includes a cross coupled inverter latch and a latch reset transistor, the global write circuit includes a reduced swing inverter and a write drive transistor, the data transfer circuit includes a read selector, a bypass tri-state inverter, a common reset transistor and a read inverter, and the data receive circuit is composed of a receive NAND gate, a receive inverter and a receive tri-state inverter.

10. The memory device of claim 1, wherein the pre-charge voltage is set around 0.5V.

11. The memory device of claim 1, wherein the locking signal generator includes a tunable delay circuit which receives an output from the global latch circuit, where tuning information for the tunable delay circuit is stored in a non-volatile memory.

12. The memory device of claim 1, wherein the pass transistor of the memory cell is composed of a MOS transistor, such as an NMOS transistor and a PMOS transistor.

13. The memory device of claim 1, wherein the pass transistor of the memory cell is formed from various materials, such as single crystalline silicon, poly crystalline silicon, silicon-germanium and germanium.

14. The memory device of claim 1, wherein the capacitor of the memory cell is composed of a MOS capacitor.

15. The memory device of claim 1, wherein the capacitor of the memory cell is composed of multiple plates for configuring a finger-like capacitor.

16. The memory device of claim 1, wherein the capacitor of the memory cell is composed of multiple capacitors, such that a first fingered shape capacitor is formed in between a first routing layer and a second routing layer, and a second fingered shape capacitor is formed in between the second routing layer and a third routing layer.

17. The memory device of claim 1, wherein the capacitor of the memory cell is composed of a cup-like capacitor.

18. The memory device of claim 1, wherein the capacitor of the memory cell is formed from various dielectric materials, such as silicon dioxide, silicon nitride, Ta2O5, TiO2, Al2O3, TiN/HfO2/TiN(TIT), and Ru/Insulator/TiN(RIT).

19. The memory device of claim 1, wherein the memory cell is stacked over peripheral circuits.

20. The memory device of claim 1, wherein the memory cell is stacked over another memory cell.

* * * * *